United States Patent
Haralabidis et al.

(10) Patent No.: US 7,634,237 B2
(45) Date of Patent: Dec. 15, 2009

(54) METHOD AND SYSTEM FOR A FRACTIONAL-N SYNTHESIZER FOR A MOBILE DIGITAL CELLULAR TELEVISION ENVIRONMENT

(75) Inventors: Nikolaos Costas-Evagelos Haralabidis, Athens (GR); Ioannis Georgios Kokolakis, Holargos (GR)

(73) Assignee: Broadcom Corporation, Irvine, CA (US)

( * ) Notice: Subject to any disclaimer, the term of this patent is extended or adjusted under 35 U.S.C. 154(b) by 437 days.

(21) Appl. No.: 11/385,401

(22) Filed: Mar. 21, 2006

(65) Prior Publication Data

US 2007/0066261 A1 Mar. 22, 2007

Related U.S. Application Data

(60) Provisional application No. 60/717,915, filed on Sep. 16, 2005, provisional application No. 60/778,232, filed on Mar. 2, 2006.

(51) Int. Cl.
*H04B 1/06* (2006.01)
(52) U.S. Cl. .......................................... 455/76; 455/255
(58) Field of Classification Search .................. 455/76, 455/255–260; 375/375, 376; 327/113, 115, 327/117
See application file for complete search history.

(56) References Cited

U.S. PATENT DOCUMENTS

2006/0135105 A1* 6/2006 Jensen ......................... 455/260
2006/0238226 A1* 10/2006 Holland et al. ............... 327/115

OTHER PUBLICATIONS

Mobile and Portable DVB-T Radio Access Interface Specification, Version 1.0, 1.1.2004, pp. 1-46, EICTA/TAC/MBRAI-02-16, European Industry Association.
Dawkins, Mark et al., A Single-Chip Turner for DVB-T, IEEE Journal of Solid-State Circuits, vol. 38, No. 8, Aug. 2003.
Antione, Patrick et al., A Direct-Conversion Receiver for DVB-H, IEEE Journal of Solid-State Circuits, vol. 40, No. 12, Dec. 2005.

* cited by examiner

*Primary Examiner*—Thanh C Le
(74) *Attorney, Agent, or Firm*—McAndrews, Held & Malloy

(57) ABSTRACT

Aspects of a method and system for a fractional-N synthesizer for a mobile digital cellular television environment are presented. Aspects of the system may include circuitry, within a phase locked loop, that enables determination of a division number at a time instant within a division cycle. A local oscillator signal may be modified based on the division number in a succeeding division cycle. A subsequent local oscillator signal may be generated based on the modification.

18 Claims, 8 Drawing Sheets

METHOD AND SYSTEM FOR A FRACTIONAL-N SYNTHESIZER FOR A MOBILE DIGITAL CELLULAR TELEVISION ENVIRONMENT

CROSS-REFERENCE TO RELATED APPLICATIONS/INCORPORATION BY REFERENCE

This application make reference to, claims priority to, and claims the benefit of:

U.S. Provisional Application Ser. No. 60/717,915 filed on Sep. 16, 2005; and

U.S. Provisional Application Ser. No. 60/778,232 filed on Mar. 2, 2006.

This application also makes reference to:

U.S. application Ser. No. 11/385,390 filed on even date herewith;

U.S. application Ser. No. 11/385,423 filed on even date herewith;

U.S. application Ser. No. 11/385,389 filed on even date herewith;

U.S. application Ser. No. 11/385,081 filed on even date herewith; and

U.S. application Ser. No. 11/385,101 filed on even date herewith.

Each of the above stated applications is hereby incorporated herein by reference in its entirety.

FIELD OF THE INVENTION

Certain embodiments of the invention relate to data communications. More specifically, certain embodiments of the invention relate to a method and system for a fractional-N synthesizer for a mobile digital cellular television environment.

BACKGROUND OF THE INVENTION

Broadcasting and telecommunications have historically occupied separate fields. In the past, broadcasting was largely an "over-the-air" medium while wired media carried telecommunications. That distinction may no longer apply as both broadcasting and telecommunications may be delivered over either wired or wireless media. Present development may adapt broadcasting to mobility services. One limitation has been that broadcasting may often require high bit rate data transmission at rates higher than could be supported by existing mobile communications networks. However, with emerging developments in wireless communications technology, even this obstacle may be overcome.

Terrestrial television and radio broadcast networks have made use of high power transmitters covering broad service areas, which enable one-way distribution of content to user equipment such as televisions and radios. By contrast, wireless telecommunications networks have made use of low power transmitters, which have covered relatively small areas known as "cells". Unlike broadcast networks, wireless networks may be adapted to provide two-way interactive services between users of user equipment such as telephones and computer equipment.

The introduction of cellular communications systems in the late 1970's and early 1980's represented a significant advance in mobile communications. The networks of this period may be commonly known as first generation, or "1G" systems. These systems were based upon analog, circuit-switching technology, the most prominent of these systems may have been the advanced mobile phone system (AMPS). Second generation, or "2G" systems ushered improvements in performance over 1G systems and introduced digital technology to mobile communications. Exemplary 2G systems include the global system for mobile communications (GSM), digital AMPS (D-AMPS), and code division multiple access (CDMA). Many of these systems have been designed according to the paradigm of the traditional telephony architecture, often focused on circuit-switched services, and voice traffic, and supported data transfer rates up to 14.4 kbits/s. Higher data rates were achieved through the deployment of "2.5G" networks, many of which were adapted to existing 2G network infrastructures. The 2.5G networks began the introduction of packet-switching technology in wireless networks. However, it is the evolution of third generation, or "3G" technology that may introduce fully packet-switched networks, which support high-speed data communications.

Standards for digital television terrestrial broadcasting (DTTB) have evolved around the world with different systems being adopted in different regions. The three leading DTTB systems are, the advanced standards technical committee (ATSC) system, the digital video broadcast terrestrial (DVB-T) system, and the integrated service digital broadcasting terrestrial (ISDB-T) system. The ATSC system has largely been adopted in North America, South America, Taiwan, and South Korea. This system adapts trellis coding and 8-level vestigial sideband (8-VSB) modulation. The DVB-T system has largely been adopted in Europe, the Middle East, Australia, as well as parts of Africa and parts of Asia. The DVB-T system adapts coded orthogonal frequency division multiplexing (COFDM). The OFDM spread spectrum technique may be utilized to distribute information over many carriers that are spaced apart at specified frequencies. The OFDM technique may also be referred to as multi-carrier or discrete multi-tone modulation. The spacing between carriers may prevent the demodulators in a radio receiver from seeing frequencies other than their corresponding frequency. This technique may result in spectral efficiency and lower multi-path distortion, for example. The ISDB-T system has been adopted in Japan and adapts bandwidth segmented transmission orthogonal frequency division multiplexing (BST-OFDM). The various DTTB systems may differ in important aspects; some systems employ a 6 MHz channel separation, while others may employ 7 MHz or 8 MHz channel separations.

While 3G systems are evolving to provide integrated voice, multimedia, and data services to mobile user equipment, there may be compelling reasons for adapting DTTB systems for this purpose. One of the more notable reasons may be the high data rates that may be supported in DTTB systems. For example, DVB-T may support data rates of 15 Mbits/s in an 8 MHz channel in a wide area SFN. There are also significant challenges in deploying broadcast services to mobile user equipment. Because of form factor constraints, many handheld portable devices, for example, may require that PCB area be minimized and that services consume minimum power to extend battery life to a level that may be acceptable to users. Another consideration is the Doppler effect in moving user equipment, which may cause inter-symbol interference in received signals. Among the three major DTTB systems, ISDB-T was originally designed to support broadcast services to mobile user equipment. While DVB-T may not have been originally designed to support mobility broadcast services, a number of adaptations have been made to provide support for mobile broadcast capability. The adaptation of DVB-T to mobile broadcasting is commonly known as DVB handheld (DVB-H). The broadcasting frequencies for Europe are in UHF (bands IV/V). In the US, the 1670-1675 MHz band has been allocated for DVB-H operation. Additional spectrum is expected to be allocated in the L-band worldwide.

To meet requirements for mobile broadcasting the DVB-H specification may support time slicing to reduce power consumption at the user equipment, addition of a 4K mode to enable network operators to make tradeoffs between the advantages of the 2K mode and those of the 8K mode, and an additional level of forward error correction on multi-protocol encapsulated data—forward error correction (MPE-FEC) to make DVB-H transmissions more robust to the challenges presented by mobile reception of signals and to potential limitations in antenna designs for handheld user equipment. DVB-H may also use the DVB-T modulation schemes, like QPSK and 16-quadrature amplitude modulation (16-QAM), which may be more resilient to transmission errors. MPEG audio and video services may be more resilient to error than data, thus additional forward error correction may not be required to meet DTTB service objectives.

While several adaptations have been made to provide support for mobile broadcast capabilities in DVB-T, concerns regarding device size, cost, and/or power requirements still remain significant constraints for the implementation of handheld portable devices enabled for digital video broadcasting operations. For example, typical DVB-T tuners or receivers in mobile terminals may employ super-heterodyne architectures with one or two intermediate frequency (IF) stages and direct sampling of the passband signal for digital quadrature down-conversion. Moreover, external tracking and SAW filters may generally be utilized for channel selection and image rejection. Such approaches may result in increased power consumption and high external component count, which may limit their application in handheld portable devices. As a result, the success of mobile broadcast capability of DVB-T may depend in part on the ability to develop direct conversion TV tuners that have smaller form factor, are produced at lower cost, and consume less power during operation.

As mobile terminals support a wider range of content from voice to data to video, they may be required to receive a correspondingly wider range of frequencies. This may require the implementation of mobile terminals that utilize a plurality of crystal oscillators that may be used based on the frequency of the received signal. For example, one crystal may be utilized for reception of GSM signals, another for reception of CDMA signals, and yet another for reception of DVB signals. The use of multiple crystals increases the cost of terminals and also increases power consumption and board space required.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for a fractional-N synthesizer for a mobile digital cellular television environment, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for a fractional-N synthesizer for a mobile digital cellular television environment. Various embodiments of the invention may provide a method and a system by which a local oscillator (LO) signal may be generated for a wide range of frequencies based on a single oscillator frequency generated by a crystal oscillator. One aspect of the invention comprises prescaler circuitry that operates with a division number that enables generation of the LO signal whose frequency is a multiple of the crystal oscillator frequency. When measured at a plurality of time instants that span a given time duration, the average division number may be an integer value, or it may be represented by a real number that comprises an integer value and a nonzero fractional value. Between a time instant and a succeeding time instant, potential division numbers may span a wider range of numerical values in various embodiments of the invention than may be achieved in some conventional fractional-N synthesizer designs.

In this aspect, a single oscillator frequency may be utilized to generate LO signal frequencies associated with a plurality of frequency bands. For example, the single oscillator frequency may be utilized to generate LO signal frequencies that may be associated with the ultra high frequency (UHF), wideband code division multiple access (WCDMA), digital video broadcasting for terrestrial and handheld devices (DVB-T, and DVB-H), and L-band frequency bands. In various embodiments of the invention, a fractional-N synthesizer may also be referred to as a phase locked loop (PLL), or fractional-N PLL.

Figure 1A:
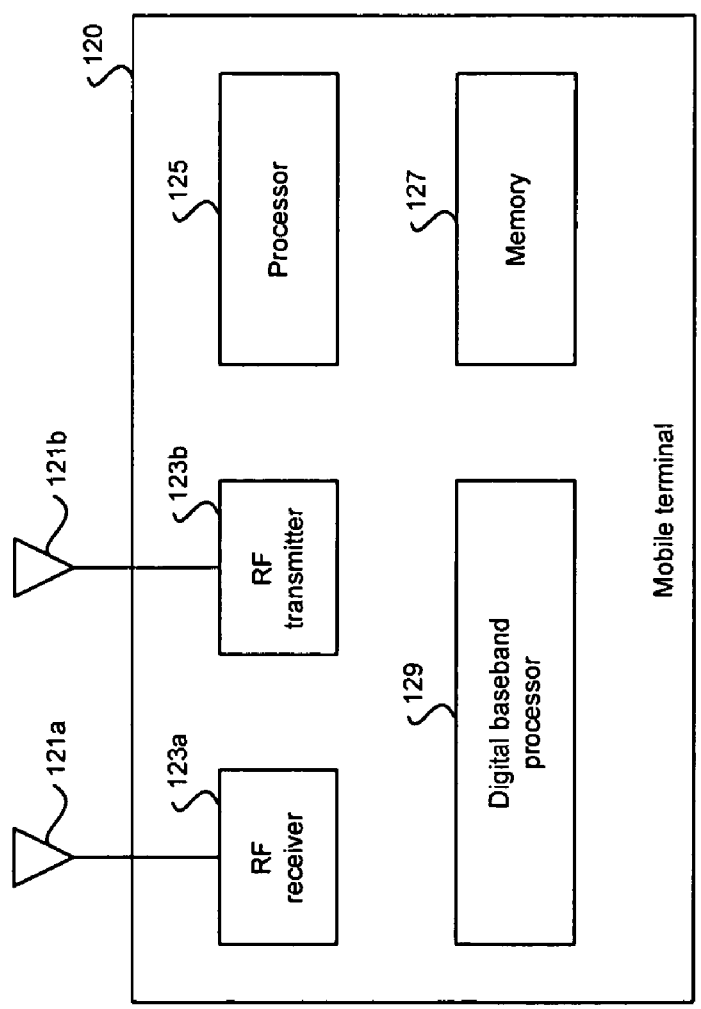
FIG. 1A is a block diagram illustrating an exemplary mobile terminal, in accordance with an embodiment of the invention.

FIG. 1A is a block diagram illustrating an exemplary mobile terminal, in accordance with an embodiment of the invention. Referring to FIG. 1A, there is shown a mobile terminal 120 that may comprise an RF receiver 123*a*, an RF transmitter 123*b*, a digital baseband processor 129, a processor 125, and a memory 127. A receive antenna 121a may be communicatively coupled to the RF receiver 123a. A transmit antenna 121b may be communicatively coupled to the RF transmitter 123b.

The mobile terminal 120 may be utilized in an exemplary network such as is disclosed in U.S. patent application Ser. No. 11/385,390, filed on even date herewith and is hereby incorporated herein by reference in its entirety.

The RF receiver 123a may comprise suitable logic, circuitry, and/or code that may enable processing of received RF signals. The RF receiver 123a may enable receiving RF signals in a plurality of frequency bands. For example, the RF receiver 123a may enable receiving DVB-H transmission signals via the UHF band, from about 470 MHz to about 890 MHz, the 1670-1675 MHz band, and/or the L-band, from about 1400 MHz to about 1700 MHz, for example. Moreover, the RF receiver 123a may enable receiving signals in cellular frequency bands, for example. Each frequency band supported by the RF receiver 123a may have a corresponding front-end circuit for handling low noise amplification and down conversion operations, for example. In this regard, the RF receiver 123a may be referred to as a multi-band receiver when it supports more than one frequency band. In another embodiment of the invention, the mobile terminal 120 may comprise more than one RF receiver 123a, wherein each of the RF receiver 123a may be a single-band or a multi-band receiver.

The RF receiver 123a may quadrature down convert the received RF signal to a baseband frequency signal that comprises an in-phase (I) component and a quadrature (Q) component. The RF receiver 123a may perform direct down conversion of the received RF signal to a baseband frequency signal, for example. In some instances, the RF receiver 123a may enable analog-to-digital conversion of the baseband signal components before transferring the components to the digital baseband processor 129. In other instances, the RF receiver 123a may transfer the baseband signal components in analog form.

The digital baseband processor 129 may comprise suitable logic, circuitry, and/or code that may enable processing and/or handling of baseband frequency signals. In this regard, the digital baseband processor 129 may process or handle signals received from the RF receiver 123a and/or signals to be transferred to the RF transmitter 123b, when the RF transmitter 123b is present, for transmission to the network. The digital baseband processor 129 may also provide control and/or feedback information to the RF receiver 123a and to the RF transmitter 123b based on information from the processed signals. The digital baseband processor 129 may communicate information and/or data from the processed signals to the processor 125 and/or to the memory 127. Moreover, the digital baseband processor 129 may receive information from the processor 125 and/or to the memory 127, which may be processed and transferred to the RF transmitter 123b for transmission to the network.

The RF transmitter 123b may comprise suitable logic, circuitry, and/or code that may enable processing of RF signals for transmission. The RF transmitter 123b may enable transmission of RF signals in a plurality of frequency bands. Moreover, the RF transmitter 123b may enable transmitting signals in cellular frequency bands, for example. Each frequency band supported by the RF transmitter 123b may have a corresponding front-end circuit for handling amplification and up conversion operations, for example. In this regard, the RF transmitter 123b may be referred to as a multi-band transmitter when it supports more than one frequency band. In another embodiment of the invention, the mobile terminal 120 may comprise more than one RF transmitter 123b, wherein each of the RF transmitter 123b may be a single-band or a multi-band transmitter.

The RF transmitter 123b may quadrature up convert the baseband frequency signal comprising I/Q components to an RF signal. The RF transmitter 123b may perform direct up conversion of the baseband frequency signal to a baseband frequency signal, for example. In some instances, the RF transmitter 123b may enable digital-to-analog conversion of the baseband signal components received from the digital baseband processor 129 before up conversion. In other instances, the RF transmitter 123b may receive baseband signal components in analog form.

The processor 125 may comprise suitable logic, circuitry, and/or code that may enable control and/or data processing operations for the mobile terminal 120. The processor 125 may be utilized to control at least a portion of the RF receiver 123a, the RF transmitter 123b, the digital baseband processor 129, and/or the memory 127. In this regard, the processor 125 may generate at least one signal for controlling operations within the mobile terminal 120. The processor 125 may also enable executing of applications that may be utilized by the mobile terminal 120. For example, the processor 125 may execute applications that may enable displaying and/or interacting with content received via DVB-H transmission signals in the mobile terminal 120.

The memory 127 may comprise suitable logic, circuitry, and/or code that may enable storage of data and/or other information utilized by the mobile terminal 120. For example, the memory 127 may be utilized for storing processed data generated by the digital baseband processor 129 and/or the processor 125. The memory 127 may also be utilized to store information, such as configuration information, that may be utilized to control the operation of at least one block in the mobile terminal 120. For example, the memory 127 may comprise information necessary to configure the RF receiver 123a to enable receiving DVB-H transmission in the appropriate frequency band.

Figure 1B:
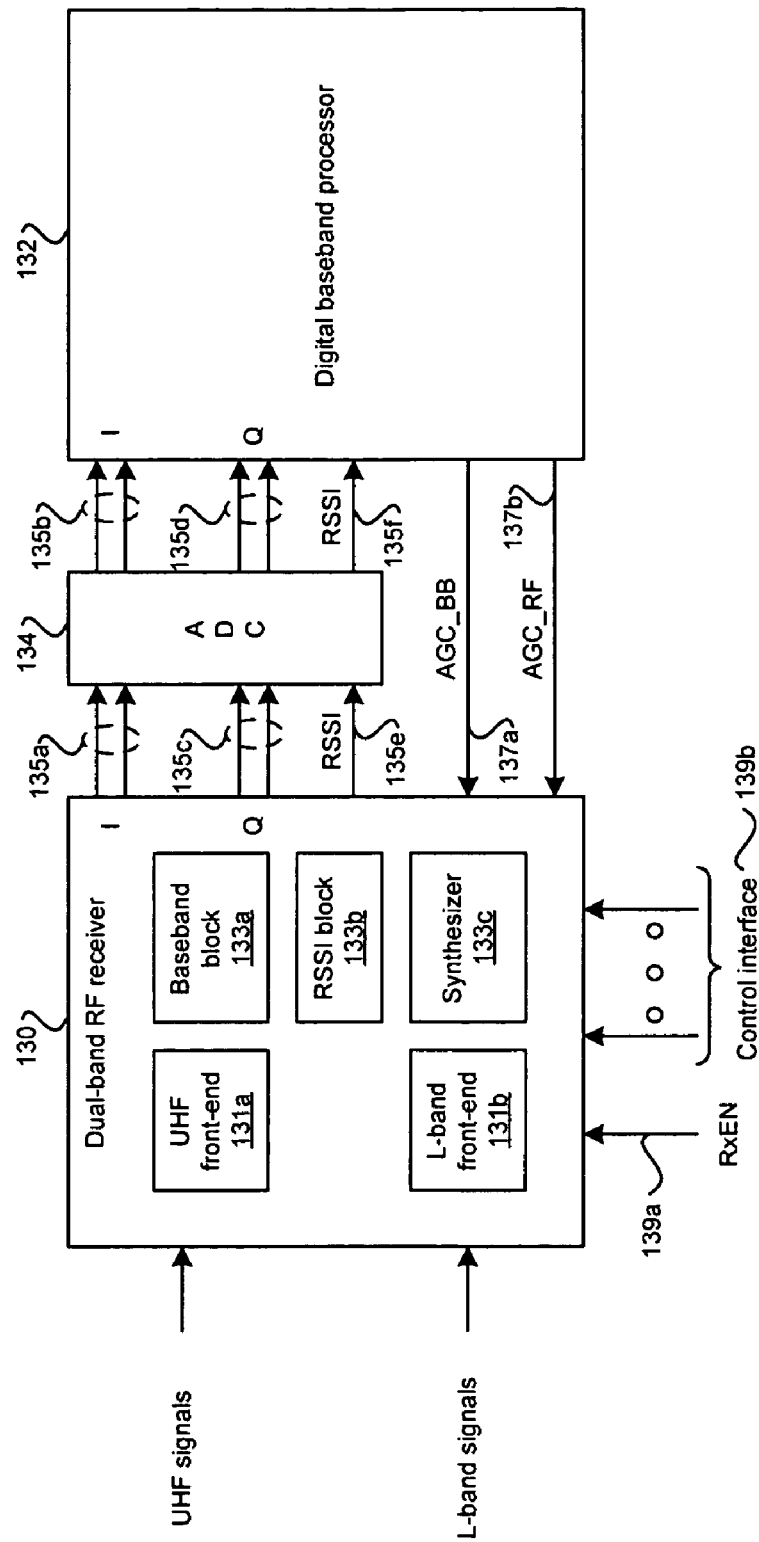
FIG. 1B is a block diagram illustrating exemplary communication between a dual-band RF receiver and a digital baseband processor in a mobile terminal, in accordance with an embodiment of the invention.

FIG. 1B is a block diagram illustrating exemplary communication between a dual-band RF receiver and a digital baseband processor in a mobile terminal, in accordance with an embodiment of the invention. Referring to FIG. 1B, there is shown a dual-band RF receiver 130, an analog-to-digital converter (ADC) 134, and a digital baseband processor 132. The dual-band RF receiver 130 may comprise a UHF front-end 131a, an L-band front-end 131b, a baseband block 133a, a received signal strength indicator (RSSI) block 133b, and a synthesizer 133c. The dual-band RF receiver 130, the analog-to-digital converter (ADC) 134, and/or the digital baseband processor 132 may be part of a mobile terminal, such as the mobile terminal 120 in FIG. 1A, for example.

The dual-band RF receiver 130 may comprise suitable logic, circuitry, and/or code that may enable handling of UHF and L-band signals. The dual-band RF receiver 130 may be enabled via an enable signal, such as the signal RxEN 139a, for example. In this regard, enabling the dual-band RF receiver 130 via the signal RxEN 139a by a 1:10 ON/OFF ratio may allow time slicing in DVB-H while reducing power consumption. At least a portion of the circuitry within the dual-band RF receiver 130 may be controlled via the control interface 139b. The control interface 139b may receive information from, for example, a processor, such as the processor 125 in FIG. 1A, or from the digital baseband processor 132. The control interface 139b may comprise more than one bit. For example, when implemented as a 2-bit interface, the control interface 139a may be an inter-integrated circuit (I2C) interface.

The UHF front-end 131a may comprise suitable logic, circuitry, and/or code that may enable low noise amplification and direct down conversion of UHF signals. In this regard, the UHF front-end 131a may utilize an integrated low noise amplifier (LNA) and mixers, such as passive mixers, for example. The UHF front-end 131a may communicate the resulting baseband frequency signals to the baseband block 133a for further processing.

The L-band front-end 131b may comprise suitable logic, circuitry, and/or code that may enable low noise amplification and direct down conversion of L-band signals. In this regard, the L-band front-end 131b may utilize an integrated LNA and mixers, such as passive mixers, for example. The L-band front-end 131b may communicate the resulting baseband frequency signals to the baseband block 133a for further processing. The dual-band RF receiver 130 may enable one of the UHF front-end 131a and the L-band front-end 131b based on current communication conditions.

The synthesizer 133c may comprise suitable logic, circuitry, and/or code that may enable generating the appropriate local oscillator (LO) signal for performing direct down conversion in either the UHF front-end 131a or the L-band front-end 131b. Since the synthesizer 133c may enable fractional division of a source frequency when generating the LO signal, a large range of crystal oscillators may be utilized as a frequency source for the synthesizer 133c. This approach may enable the use of an existing crystal oscillator in a mobile terminal PCB, thus reducing the number of external components necessary to support the operations of the dual-band RF receiver 130, for example. The synthesizer 133 may generate a common LO signal for the UHF front-end 131a and for the L-band front-end 131b. In this regard, the UHF front-end 131a and the L-band front-end 131b may enable dividing the LO signal in order to generate the appropriate signal to perform down conversion from the UHF band and from the L-band respectively. In some instances, the synthesizer 133 may have at least one integrated voltage controlled oscillator (VCO) for generating the LO signal. In other instances, the VCO may be implemented outside the synthesizer 133.

The baseband block 133a may comprise suitable logic, circuitry, and/or code that may enable processing of I/Q components generated from the direct down conversion operations in the UHF front-end 131a and the L-band front-end 131b. The baseband block 133a may enable amplification and/or filtering of the I/Q components in analog form. The baseband block 133a may communicate the processed I component, that is, signal 135a, and the processed Q component, that is, signal 135c, to the ADC 134 for digital conversion.

The RSSI block 133b may comprise suitable logic, circuitry, and/or code that may enable measuring the strength, that is, the RSSI value, of a received RF signal, whether UHF or L-band signal. The RSSI measurement may be performed, for example, after the received RF signal is amplified in either the UHF front-end 131a or the L-band front-end 131b. The RSSI block 133b may communicate the analog RSSI measurement, that is, signal 135e, to the ADC 134 for digital conversion.

The ADC 134 may comprise suitable logic, circuitry, and/or code that may enable digital conversion of signals 135a, 135c, and/or 135e to signals 135b, 135d, and/or 135f respectively. In some instances, the ADC 134 may be integrated into the dual-band RF receiver 130 or into the digital baseband processor 132.

The digital baseband processor 132 may comprise suitable logic, circuitry, and/or code that may enable processing and/or handling of baseband frequency signals. In this regard, the digital baseband processor 132 may be the same or substantially similar to the digital baseband processor 129 described in FIG. 1A. The digital baseband processor 132 may enable generating at least one signal, such as the signals AGC_BB 137a and AGC_RF 137b, for adjusting the operations of the dual-band RF receiver 130. For example, the signal AGC_BB 137a may be utilized to adjust the gain provided by the baseband block 133a on the baseband frequency signals generated from either the UHF front-end 131a or the L-band front-end 131b. In another example, the signal AGC_RF 137b may be utilized to adjust the gain provided by an integrated LNA in either the UHF front-end 131a or the L-band front-end 131b. In another example, the digital baseband processor 132 may generate at least one control signal or control information communicated to the dual-band RF receiver 130 via the control interface 139b for adjusting operations within the dual-band RF receiver 130.

Figure 1C:
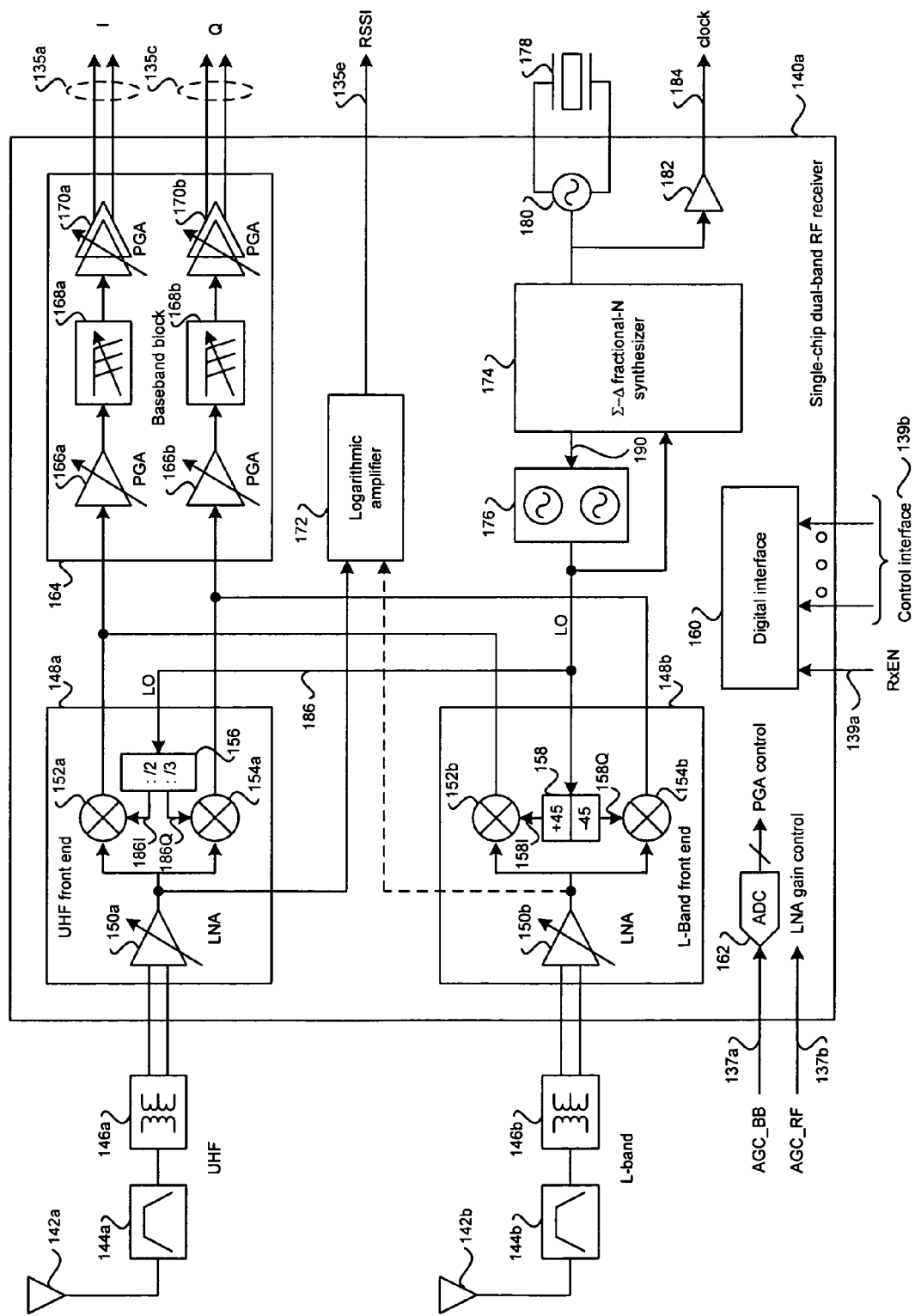
FIG. 1C is a block diagram illustrating an exemplary single-chip dual-band RF receiver with an integrated LNA in each front-end, in accordance with an embodiment of the invention.

FIG. 1C is a block diagram illustrating an exemplary single-chip dual-band RF receiver with an integrated LNA in each front-end, in accordance with an embodiment of the invention. Referring to FIG. 1C, there is shown a single-chip dual-band RF receiver 140a that may comprise a UHF front-end 148a, an L-band front-end 148b, a baseband block 164, a logarithmic amplifier (logarithmic amplifier) 172, a Σ-Δ fractional-N synthesizer 174, a VCO block 176, a digital interface 160, an ADC 162, an oscillator 180, and a buffer 182.

The single-chip dual-band RF receiver 140a may be fabricated using any of a plurality of semiconductor manufacturing processes, for example, complimentary metal-oxide-semiconductor (CMOS) processes, bipolar CMOS (BiCMOS), or Silicon Germanium (SiGe). The single-chip dual-band RF receiver 140a may be implemented using differential structures to minimize noise effects and/or substrate coupling, for example. The single-chip dual-band RF receiver 140a may utilize low drop out (LDO) voltage regulators to regulate and clean up on-chip voltage supplies. In this regard, the LDO voltage regulators may be utilized to transform external voltage sources to the appropriate on-chip voltages.

When the single-chip dual-band RF receiver 140a is implemented utilizing a CMOS process, some design considerations may include achieving low noise figure (NF) values, wide-band operation, high signal-to-noise ration (SNR), performing DC offset removal, achieving high input second-order and third-order intercept points (IIP2 and IIP3), and/or reducing I/Q mismatch, for example.

The single-chip dual-band RF receiver 140a may receive UHF signals via a first antenna 142a, a UHF filter 144a, and a first balum 146a. The UHF filter 144a enables band pass filtering, wherein the band pass may be about 470 to about 702 MHz for cellular signals, for example, or about 470 to about 862 MHz, for other types of received signals, for example. The balum 146a enables balancing the filtered signals before being communicated to the UHF front-end 148a.

The single-chip dual-band RF receiver 140a may receive L-band signals via a second antenna 142b, an L-band filter 144b, and a second balum 146b. The L-band filter 144b enables band pass filtering, wherein the band pass may be about 1670 to about 1675 MHz for signals in US systems, for example, or about 1450 to about 1490 MHz, for signals in European systems, for example. The balum 146b enables balancing the filtered signals before being communicated to the L-band front-end 148a. In some instances, antennas 142a and 142b may be implemented utilizing a single antenna communicatively coupled to the single-chip dual-band RF receiver 140a that may support receiving radio signals operating in the UHF IV/V and/or L-band, for example.

The UHF front-end 148a may comprise a variable low noise amplifier (LNA) 150a, a mixer 152a, a mixer 154a, and a LO signal divider 156. The variable LNA 150a may comprise suitable logic and/or circuitry that may enable amplification of the UHF signals received. Matching between the output of the balum 146a and the input of the variable LNA 150a may be achieved by utilizing off-chip series inductors, for example. The variable LNA 150a may implement continuous gain control by current steering that may be controlled by a replica scheme within the variable LNA 150a. The gain of the variable LNA 150a may be adjusted via the signal AGC_RF 137b, for example.

The mixers 152a and 154a may comprise suitable logic and/or circuitry that may enable generating in-phase (I) and quadrature (Q) components of the baseband frequency signal based on direct down conversion of the amplified received UHF signal with the quadrature signals 186I and 186Q generated by the divider block 156. The mixers 152a and 154a may be passive mixers in order to achieve high linearity and/or low flicker noise, for example. The LO signal divider 156 may comprise suitable logic, circuitry, and/or code that may enable dividing of the LO signal 186 by a factor of 2 (:/2) or a factor of 3 (:/3) and at the same time provide quadrature outputs 186I and 186Q, wherein 186I and 186Q have 90 degrees separation between them. The factor of 3 division may be used when the received UHF signal band is about 470 to about 600 MHz, for example. The factor of 2 division may be used when the received UHF signal band is about 600 to about 900 MHz, for example. The I/Q components generated by the mixers 152a and 154a may be communicated to the baseband block 164.

The L-band front-end 148b may comprise a variable LNA 150b, a mixer 152a, a mixer 154a, and a LO signal generator 158. The variable LNA 150a may comprise suitable logic and/or circuitry that may enable amplification of the L-band signals received. Matching between the output of the balum 146b and the input of the variable LNA 150b may be achieved by utilizing off-chip series inductors, for example. The variable LNA 150b may implement continuous gain control by current steering that may be controlled by a replica scheme within the variable LNA 150b. The gain of the variable LNA 150b may be adjusted via the signal AGC_RF 137b, for example.

The mixers 152b and 154b may comprise suitable logic and/or circuitry that may enable generating I/Q components of the baseband frequency signal based on the direct down conversion of the amplified received L-band signal with the LO signals 158I and 158Q generated by the LO generator block 158. The mixers 152b and 154b may be passive mixers in order to achieve high linearity and/or low flicker noise, for example. The LO signal generator 158 may comprise suitable logic, circuitry, and/or code that may enable generation of quadrature LO signals 158I and 158Q, that is, signals with 90 degree phase split between them, from the LO signal 186. The I/Q components generated by the mixers 152b and 154b may be communicated to the baseband block 164.

The logarithmic amplifier 172 may comprise suitable logic, circuitry, and/or code that may enable generation of a wideband, received signal strength indicator (RSSI) signal, such as the signal 135e, based on the output of the variable LNA 150a. The RSSI signal indicates the total amount of signal power that is present at the output of the LNA, for example. The RSSI signal may be utilized by, for example, the digital baseband processor 132 in FIG. 1B, to adjust the gain of the variable LNA 150a in the presence of RF interference to achieve NF and/or linearity performance that meets blocking and/or intermodulation specifications, for example. In this regard, interference may refer to blocker signals, for example. Blocker signals may be unwanted signals in frequency channels outside the wanted or desired channel that may disturb the reception of the wanted signals. This effect may be a result of blockers generating large signals within the receiver path. These large signals may introduce harmonics, intermodulation products, and/or unwanted mixing products that crosstalk with the wanted signals. In another embodiment of the invention, the logarithmic amplifier 172 may enable generating a wideband, RSSI signal, such as the signal 135e, based on the output of the variable LNA 150b. In this instance, the RSSI signal may be utilized by to adjust the gain of the variable LNA 150b.

The baseband block 164 may comprise an in-phase component processing path and a quadrature component processing path. The in-phase processing path may comprise at least one programmable gain amplifier (PGA) 166a, a baseband filter 168a, and at least one PGA 170a. The quadrature component processing path may comprise at least one PGA 166b, a baseband filter 168b, and at least one PGA 170b. The PGAs 166a, 166b, 170a, and 170b may comprise suitable logic, circuitry, and/or code that may enable amplification of the down converted components of the baseband frequency signal generated by the RF front-end. The gain of the PGAs 166a, 166b, 170a, and 170b may be digitally programmable. In addition, at the output of the PGAs 166a and 166b, a programmable pole may be utilized to reduce linearity requirements for the baseband filters 168a and 168b respectively. Since the static and time-varying DC offset may saturate the operation of the single-chip dual-band RF receiver 140a, the PGAs 166a, 166b, 170a, and 170b may utilize DC servo loops to address DC offset issues. The gain of the PGAs 166a, 166b, 170a, and/or 170b may be controlled via the AGC_BB signal 137a, for example. In this regard, the ADC 162 may be utilized to provide digital control of the PGAs 166a, 166b, 170a, and/or 170b when the AGC_BB signal 137a is an analog signal.

The baseband filters 168a and 168b may comprise suitable logic, circuitry, and/or code that may enable channel selection, for example. Channel selection may be performed by filters, such as an $N^{th}$ order lowpass Chebyschev filter implemented by active integrators in a leapfrog configuration, for example. For the correct tuning of the characteristics of the filters, an on-chip auto-calibration loop may be activated upon power-up. The auto-calibration loop may set up the corner frequency to the correct vale required to meet the requirements of the communications standard for which the receiver is designed. For DVB-T/DVB-H, the value $f_o$ of the filter response may be set to a value from 2 to 5 MHz thus supporting the different channel bandwidths of 5-8 MHz specified by DVB-T/DVB-H standards. During auto-calibration, a tone at the appropriate $f_{-3dB}$ may be generated on-chip and may be applied at the input of the baseband filters 168a and 168b for comparison with the filter output of a root-mean-squared (RMS) detector. A digitally controlled loop may be utilized to adjust the baseband filter bandwidth until the output of the baseband filter and the RMS detector are the same.

The Σ-Δ fractional-N synthesizer 174 may comprise suitable logic, circuitry, and/or code that may enable LO generation that may be independent of the reference crystal frequency, such as the crystal 178, for example. In this regard, the synthesizer 174 may generate a signal, such as the signal 190, for example, to control the operation of the VCO block 176 and therefore the generation of the LO signal 186. Since the synthesizer 174 may enable fractional synthesis, the single-chip dual band RF receiver 140a may utilize the same crystal utilized by other operations in the mobile terminal while maintaining fine tuning capability. The synthesizer 174 may receive a reference frequency signal from the crystal 178 via an oscillator 180, for example. The output of the oscillator 180 may also be buffered by the buffer 182 to generate a clock signal 184, for example.

The VCO block 176 may comprise suitable logic, circuitry, and/or code that may enable generating the LO signal 186 utilized by the UHF front-end 148a and the L-band front-end 148b for direct down conversion of the received RF signals. The VCO block 176 may comprise at least one VCO, wherein each VCO may have cross-coupled NMOS and PMOS devices and metal-oxide-semiconductor (MOS) varactors in an accumulation mode for tuning. In this regard, a switched varactor bank may be utilized for providing coarse tuning. The VCO block 176 may provide a range of about 1.2 to about 1.8 GHz when implemented utilizing two VCOs, for example. When more than one VCO is utilized in implementing the VCO block 176, selecting the proper VCO for generating the LO signal 186 may be based on the type of RF signal being received by the single-chip dual band RF receiver 140a.

The digital interface 160 may comprise suitable logic, circuitry, and/or code that may enable controlling circuitry within the single-chip dual band RF receiver 140a. The digital interface 160 may comprise a plurality of registers for storing control and/or operational information for use by the single-chip dual-band RF receiver 140a. The digital interface 160 may enable receiving the signal RxEN 139a that may be utilized to perform 1:10 ON/OFF ratio time slicing in DVB-H while reducing power consumption. Moreover, the digital interface 160 may enable receiving the control interface 139b from, for example, a processor, such as the processor 125 in FIG. 1A, or from the digital baseband processor 132 in FIG. 1B. The control interface 139b may comprise more than one bit. The control interface 139b may be utilized to control the synthesis operations of the synthesizer 174 and/or the filtering operations of the baseband filters 168a and 168b. The control interface 139b may also be utilized to adjust the bias of circuits within the single-chip dual-band RF receiver 140a, such as those of the variable LNAs 150a and 150b, the PGAs 166a, 166b, 170a, and 170b, and/or the baseband filters 168a and 168b, for example.

Figure 2:
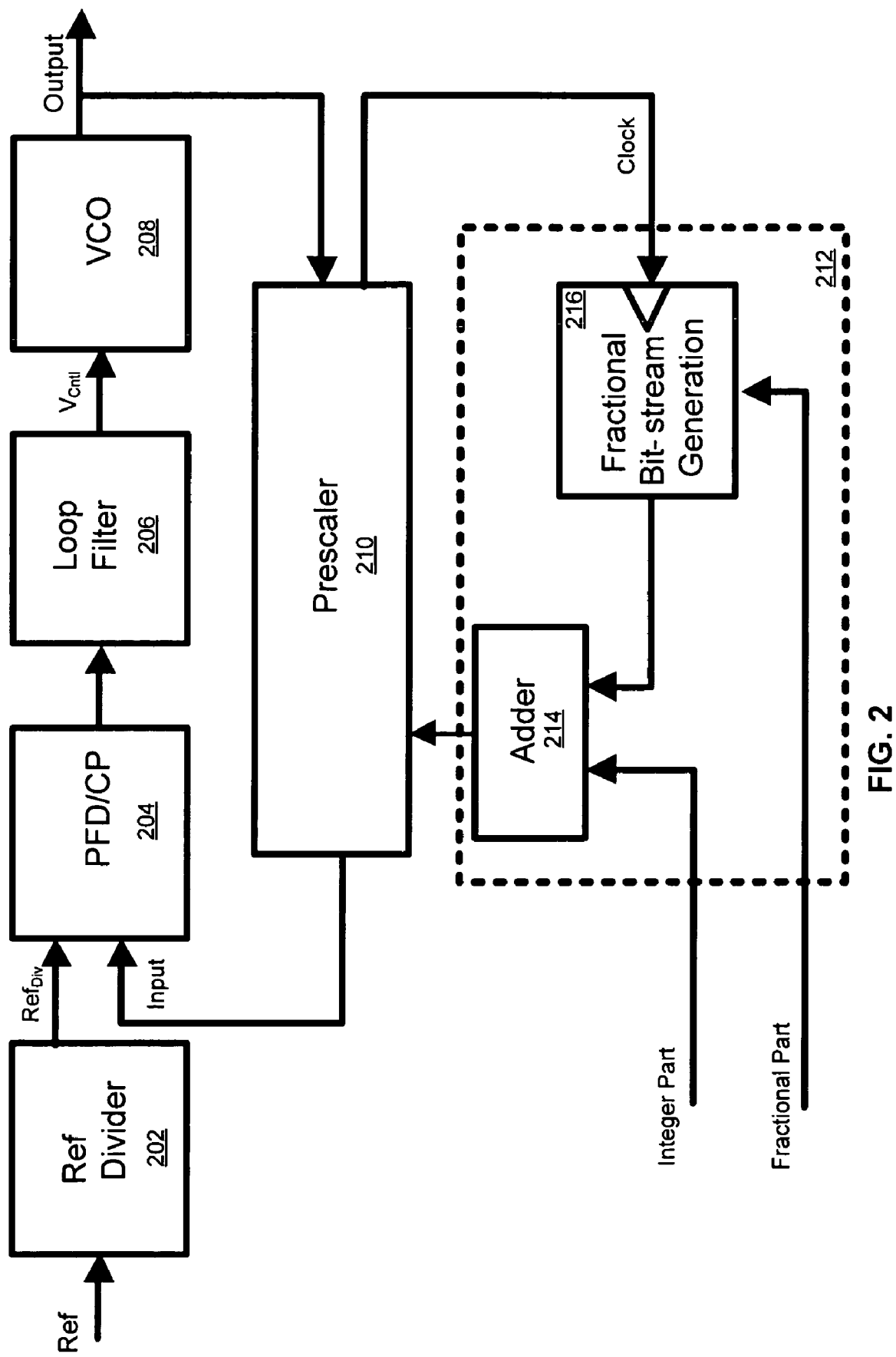
FIG. 2 is a block diagram of an exemplary Fractional-N phase locked loop (PLL) circuit, in accordance with an embodiment of the invention.

FIG. 2 is a block diagram of an exemplary Fractional-N phase locked loop (PLL) circuit, in accordance with an embodiment of the invention. Referring to FIG. 2 there is shown a reference divider block 202, a phase frequency detector and charge pump block (PFD/CP) 204, a loop filter block 206, a voltage controlled oscillator (VCO) 208, a prescaler block 210, and a division number (N) generation block 212. The N generation block 212 may comprise an adder block 214 and a fractional bit stream generation block 216. Also shown in FIG. 2 are a reference (Ref) signal, a Ref signal after division ($Ref_{Div}$) signal, an Input signal, a control voltage $V_{Cntl}$, an Output signal, an Integer Part signal, a Fractional Part signal, and a Clock signal.

The reference divider block 202 may comprise suitable circuitry, logic, and/or code that may be utilized to enable generation of the $Ref_{Div}$ signal based on the Ref signal. The frequency associated with the Ref signal may be a multiple or a fraction of the frequency associated with the $Ref_{Div}$ signal. The period of the frequency associated with the Ref signal may be a corresponding fraction or multiple of the period of the frequency associated with the $Ref_{Div}$ signal. In various embodiments of the invention, the frequency and period associated with the $Ref_{Div}$ signal may be about equal to the frequency and period associated with the Ref signal.

The PFD/CP block 204 may comprise suitable circuitry, logic, and/or code that may be utilized to enable generation of a current i(s) based on the $Ref_{Div}$ signal and the Input signal. The PFD function in the PFD/CP block 204 may be utilized to enable generation of a signal based on a phase difference between the $Ref_{Div}$ signal and the Input signal. The PFD function in the PFD/CP block 204 may be utilized to enable generation of the current, i(s), based on the generated signal. The average direct current (DC) value associated with the current i(s), $I_{DC}$, may be based on the phase difference between the $Ref_{Div}$ signal and the Input signal, where the variable s may represent a frequency associated with the generated signal upon which the value associated with the current i(s) may depend. For a DC value, the value associated with the frequency, s, may be about equal to 0.

The loop filter 206 may comprise suitable circuitry, logic, and/or code that may be utilized to enable generation of the control voltage $V_{Cntl}$ based on the current i(s). The loop filter 206 may be characterized by an impedance that varies as a function of frequency, $Z_{loop}(s)$, where the variable s may represent the frequency of a signal applied to the loop filter 206. An approximate value associated with control voltage $V_{Cntl}$ may be represented by a value as shown in the following equation:

$$V_{Cntl}(s) = Z_{loop}(s) * i(s) \qquad \text{equation[1]}$$

The VCO 208 may comprise suitable circuitry, logic, and/or code that may be utilized to enable generation of a LO signal based on the control voltage $V_{Cntl}$. The definition of the LO signal may comprise an amplitude, a phase, and/or a frequency.

The prescaler block 210 may comprise suitable circuitry, logic, and/or code that may be utilized to generate the Input signal based on the Output signal and a division number N. The prescaler block 210 may also be utilized to enable generation of the Clock signal. The frequency associated with the Output signal may be a multiple of the frequency associated with the Input signal. The period of the frequency associated with the Output signal may be a corresponding fraction of the period of the frequency associated with the Input signal. In various embodiments of the invention, the frequency associated with the Output signal may be about N times the frequency associated with the Input signal, and the period associated with the Output signal may be about equal to 1/N times the period associated with the Input signal.

The division number N generator block 212 may comprise suitable circuitry, logic, and/or code that may be utilized to enable generation of the division number N based on the Input Part signal, the Fractional Part signal, and the Clock signal. The fractional bit stream generation block 216 may comprise suitable circuitry, logic, and/or code that may be utilized to enable generation of a bit stream that may represent a fractional part associated with the value of the division number N. The bit stream may be generated based on the Fractional Part signal. The value of the fractional part represented in the bit stream may be determined at time instants based on the Clock signal. Each time instant may correspond to a time instant within a division cycle. A division cycle may comprise a time duration about equal to the period associated with the $Ref_{Div}$ signal. The value associated with the division number N may be constant within a division period but may differ in value in different division periods. For example, in various embodiments of the invention, while N=63 during an $m^{th}$ division cycle, N=65 may occur in the $(m+1)^{th}$ division cycle, and N=62 may occur in the $(m+2)^{th}$ division cycle. The adder block 214 may comprise suitable circuitry, logic, and/or code that may be utilized to enable generation of the division number N based on the Integer Part signal, and the generated bit stream.

In operation, the reference divider block 202 may receive the reference signal Ref. The reference divider block 202 may generate a $\text{Ref}_{Div}$ signal whose frequency may be a multiple or a fraction of the frequency associated with the Ref signal. The prescaler block 210 may divide the frequency associated with the Output signal based on a current value of the division number N to generate an Input signal whose frequency is about $1/N^{th}$ of the value of the frequency associated with the $\text{Ref}_{Div}$ signal. The PFD/CP block 204 may compare a phase associated with the $\text{Ref}_{Div}$ signal and a phase associated with the Input signal to generate a current i(s). The loop filter block 206 may utilize the current i(s) to generate a control voltage $V_{Cntl}$. The VCO block 208 may generate an Output signal whose frequency may be based on the control voltage $V_{Cntl}$.

The prescaler 210 may also generate a Clock signal. At various time instants a signal level associated with the Clock signal may change, for example the signal level may change from a logic level LOW to a logic level HIGH. At the corresponding time instants, the fractional bit stream generation block 216 may determine a current value of a fractional part generated based on the Fractional Part signal. The determined current value may be output by the fractional bit stream generation block 216 and received as input by the adder block 214. The adder block 214 may compute a new division number N based on the generated fractional part and on the received Integer Part signal. The new division number N may be output from the division number generation block 212 and received as input at the prescaler block 210. The prescaler block 210 may utilize the received new division number N as the division number during the succeeding division cycle.

The phase locked loop (PLL) 174 may implement a feedback loop that enables a subsequent LO signal to be generated based on an LO signal. The LO signal generated by the VCO 208 may be frequency divided by the prescaler 210. The frequency divided signal may be input to the phase frequency detector and charge pump 204 where the phase associated with the frequency divided signal may be compared to a corresponding phase associated with a signal generated based on a reference signal Ref. Based on the phase comparison, a subsequent control voltage $V_{Cntl}$ may be applied to the input of the VCO 208. The VCO 208 may generate the subsequent LO signal.

Figure 3:
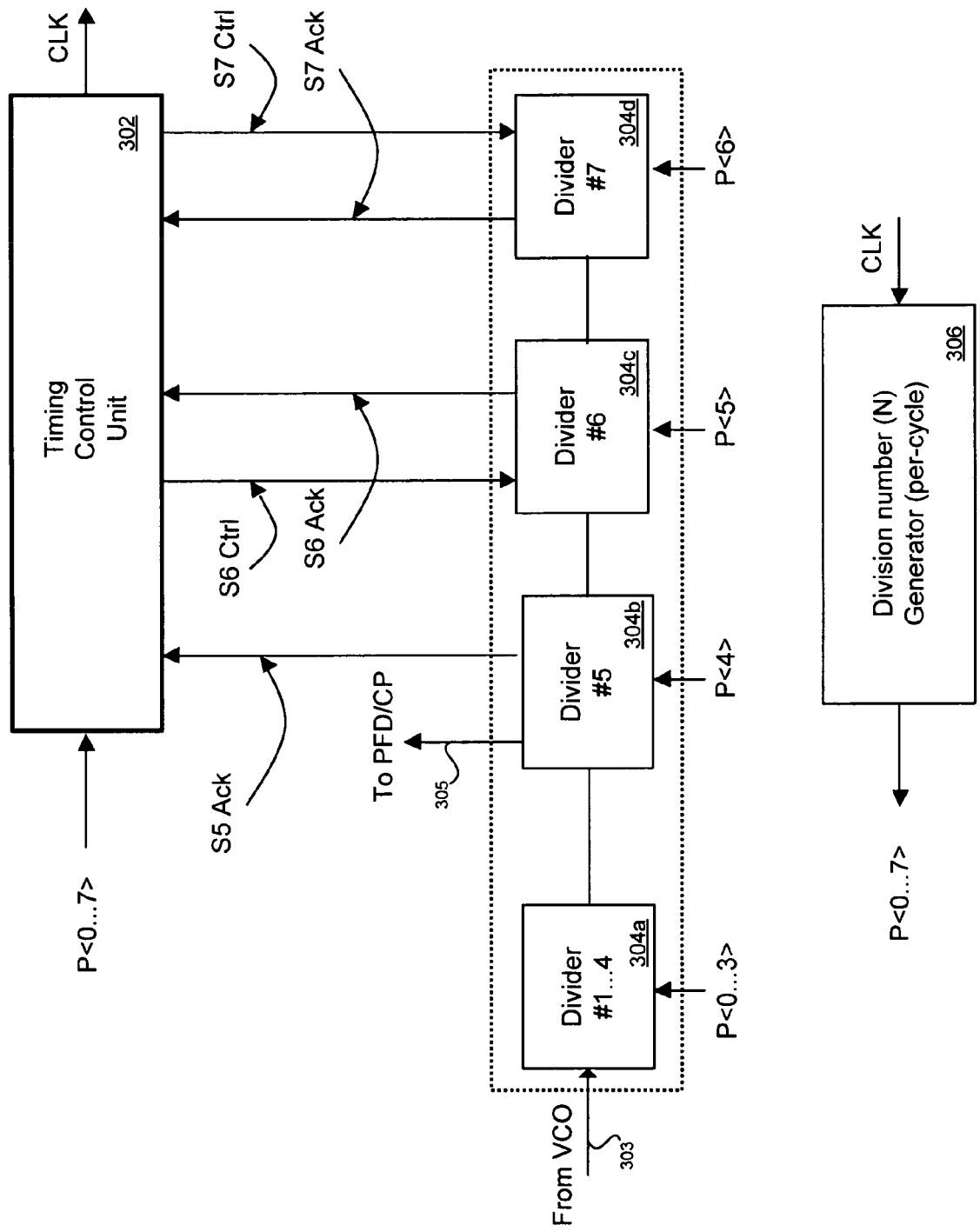
FIG. 3 is a block diagram of an exemplary prescaler circuit, in accordance with an embodiment of the invention.

FIG. 3 is a block diagram of an exemplary prescaler circuit, in accordance with an embodiment of the invention. Referring to FIG. 3, there is shown a timing control unit (TCU) 302, a plurality of divider blocks 304a, 304b, 304c, and 304d, and a division number generator 306. Also shown is a bit stream P<0 . . . 7>, a plurality of bits P<0 . . . 3>, bits P<4>, P<5>, and P<6>, a clock (Clk) signal, an output PFD signal 305 (To PFD/CP), an input VCO (From VCO) signal 303, an S5 acknowledgment (Ack) signal, an S6 control (Ctrl) signal, an S6 Ack signal, an S7 Cntl signal, an S7 Ack signal. In various embodiments of the invention, the prescaler 210 may comprise the TCU 302, and plurality of divider blocks 304a, 304b, 304c, and 304d. The bit stream P<0 . . . 7> may be represented by an 8 bit word comprising binary data, for example. The plurality of bits P<0 . . . 3> may comprise a subset of the bits in the 8 bit word, for example 4 bits. In various embodiments of the invention, the bits P<0 . . . 3> may correspond to the 4 least significant bits (LSBs) in the 8 bit word representing the bit stream P<0 . . . 7>. The bits P<4>, P<5>, and P<6> may correspond to the $5^{th}$, $6^{th}$, and $7^{th}$ LSBs in the 8 bit word, respectively.

The TCU block 302 may comprise suitable circuitry, logic, and/or code that may be utilized to enable generation of the Clk signal based on the bit stream P<0 . . . 7>, and one or more Ack signals S5 Ack, S6 Ack, and/or S7 Ack. The TCU block 302 may also be utilized to enable generation of one or more control signals comprising S6 Ctrl and S7 Ctrl.

The divider block 304a may comprise suitable circuitry, logic, and/or code that may be utilized to enable frequency division of the input VCO signal 303. The divider block 304a may implement frequency division based on the plurality of bits P<0 . . . 3>. The plurality of bits P<0 . . . 3> may comprise individual bits P<0>, P<1>, P<2>, and P<3>, for example. The divider block 304a may comprise a corresponding number of divider stages, for example 4. Each stage may be correspondingly numbers, for example, stage 0, stage 1, stage 2, and stage 3. The aggregate scale factor, $N_1$, corresponding to the divider block 304a may be computed based on the values associated with the individual bits corresponding to each stage based on the following equation, for example:

$$N_1 = 2^4 + \sum_{stage=0}^{3} (2^{stage} * |P<\text{stage}>|) \qquad \text{equation [2]}$$

For example, for an input VCO signal 303 whose associated frequency is $f_{VCO}$, the frequency of a signal subsequent to partial frequency division by the divider block 304a may be about $f_{VCO}/N_1$.

The divider block 304b may comprise suitable circuitry, logic, and/or code that may be utilized to enable frequency division of the input VCO signal 303 subsequent to partial frequency division based on the aggregate scale factor $N_1$. The divider block 304b may implement frequency division based on the bit P<4>. The bit P<4> may be utilized to enable setting of a value for a corresponding stage scale factor $n_4$. In various embodiments of the invention, potential values for $n_4$ that may be set by the corresponding bit from P<4> may comprise 2 or 3, for example. For example, when bit P<4>=0, $n_4$=2, and when P<4>=1, $n_4$=3. For example, for an input VCO signal 303 whose associated frequency is $f_{VCO}$, the frequency of a signal subsequent to partial frequency division by the divider blocks 304a and 304b may be about $f_{VCO}/N_2$, where $N_2$ is calculated according to equation[3], for example:

$$N_2 = 2^5 + \sum_{stage=0}^{4} (2^{stage} * |P<\text{stage}>|) \qquad \text{equation [3]}$$

When the divider block 304b has completed frequency division in the current division cycle an S5 Ack signal may be generated with a corresponding signal level to indicate the completion. For example, prior to completion of frequency division, the signal level associated with the S5 Ack signal may be LOW, after completion, the signal level may be HIGH.

The divider block 304c may comprise suitable circuitry, logic, and/or code that may be utilized to enable frequency division of the input VCO signal 303 subsequent to partial frequency division by the divider blocks 304a and 304b. The divider block 304c may implement frequency division based on the bit P<5> and the S6 Ctrl signal. The bit P<5> may be utilized to enable setting of a value for a corresponding stage scale factor $n_5$. In addition, the S6 Ctrl signal may be utilized to enable the operation of the divider block 304c.

When the divider block 304c has completed frequency division in the current division cycle an S6 Ack signal may be generated with a corresponding signal level to indicate the completion. For example, prior to completion of frequency division, the signal level associated with the S6 Ack signal may be LOW, after completion, the signal level may be HIGH.

The divider block 304d may comprise suitable circuitry, logic, and/or code that may be utilized to enable frequency division of the input VCO signal 303 subsequent to partial frequency division by the divider blocks 304a, 304b, and 304c. The divider block 304c may implement frequency division based on the bit P<6> and the S7 Ctrl signal. The operation of the divider block 304d may be substantially as described for the divider block 304c. For example, for an input VCO signal 303 whose associated frequency is $f_{VCO}$, the frequency of a signal subsequent to partial frequency division by the divider blocks 304a, 304b, 304c, and 304d may be about $f_{VCO}/N_3$ where $N_3$ is calculated according to equation[4], for example:

$$N_3 = 2^6 + \sum_{stage=0}^{5} (2^{stage} * |P < stage > |) \qquad \text{equation [4]}$$

In operation, the TCU 302 may generate a Clk signal substantially as described for the Clock signal from the prescaler 210. Based on the S5 Ack, and/or S6 Ack, and/or S7 Ack signals, the TCU 302 may determine that frequency division of the input VCO signal 303 has been completed in a current division cycle. The frequency division may be based on a division number N associated with the current division cycle. Subsequent to completion of frequency division in the current division cycle, a signal level associated with the Clk signal may change in anticipation of generation of a new division number N for the succeeding division cycle. At various time instants when the signal level associated with the Clk signal changes from LOW to HIGH the division number N generator 306 may determine a division number N. The division number N generator 306 may output a representation of the division number N in the bit stream P<0 . . . 7>. The TCU 302 may store the output bit stream P<0 . . . 7>. At the beginning of the succeeding division cycle, the TCU 302 may utilize at least a portion of bits contained in the bit stream P<0 . . . 7> to set corresponding values for signal levels for S6 Ctrl and S7 Ctrl, respectively. Within the current division cycle, the plurality of dividers 304a, 304b, 304c, and 304d may divide a frequency associated with the input VCO signal 303, received as the Output signal from the VCO block 208, based on the division number N. The value associated with the division number N may be determined based on the individual stage scale factors $n_{stage}$ as described in equation[3], for example. The resulting output PFD signal 305 may be communicated as the Input signal to the PFD/CP block 204.

In various embodiments of the invention the value associated with the division number N during a division cycle may be represented as being within a range of values. The range of values may be determined based on the highest numbered engaged division stage among the plurality of division stages 0, 1, . . . , 6. The highest numbered engaged division stage may be indicated by an index m. A division stage may be considered as being continuously engaged if there is no corresponding S<division stage>Ctrl signal. For example, the division stages 0, 1, 2, 3, 4, and 5 may be continuously engaged. Consequently, the minimum value associated with the index m may be m=5. If the signal level associated with the S6 Ctrl signal is HIGH while the signal level associated with the S7 Ctrl signal is LOW, m=6, for example. If the signal level associated with the S7 Ctrl signal is HIGH, m=7, for example.

The resulting output PFD signal 305 may be output from the division block associated with the highest numbered continuously engaged division stage, for example.

Given an index m, a range of potential values for the division number N may be represented as in the following equation:

$$2^m \leq N \leq 2^{m+1} - 1 \qquad \text{equation[5]}$$

For example, given an index value m=5, the corresponding range of division number N values may comprise 32 to 63. If the division number N during a current division cycle is N=63, the division blocks 304c and 304d may not be engaged. The output PFD signal 305 may be generated by the divider block 304b, for example.

For example, given an index value m=6, the corresponding range of division number N values may comprise 64 to 127. If the division number N during the succeeding division cycle is N=65, the division block 304c may be engaged during the succeeding division cycle. The S6 Ctrl signal level may be set to HIGH to engage the division block 304c during the succeeding division cycle.

If the division number N during a subsequent division cycle is N=62, the division block 304c may be disengaged during the subsequent division cycle. The S6 Ctrl signal level may be set to LOW to disengage the division block 304c during the subsequent division cycle.

In various embodiments of the invention, the division number N may be changed from a value in a current value range during a current division cycle to a succeeding value range during a succeeding division cycle without interrupting the operation of the PLL. For example, the transition of the division number N from the value utilized in the current division cycle, to the value utilized in the succeeding division cycle, may occur without imposing an interim time delay during which the PLL is not operating. The PLL may be considered as being not operating if the division number N at a given time instant is not about equal to a determined or computed division number N for the given time instant.

The ability to change the division number N among a plurality of value ranges may enable a PLL to be utilized to support generation of a wide range of frequencies based on a single oscillator frequency generated by a single crystal oscillator, for example.

In some conventional PLL implementations, the process of engaging and/or disengaging divider stages may result in an interruption of PLL operation. This, in turn may limit the range of frequencies that may be generated based on a single crystal oscillator, for example. Such conventional PLL implementations may require multiple crystal oscillators that may be switched in or out during various division cycles to generate a range of frequencies comparable to the range achievable in various embodiments of the invention when utilizing a single crystal oscillator.

In various embodiments of the invention one or more of the exemplary stages 0, 1, . . . , 6 may be controlled in a manner substantially as described for stages 5 and 6. For example, the stage 4 divider in the division block 304b may be controlled by an S5 Ctrl signal, or the stage 3 divider in the division block 304a may be controlled by an S4 Ctrl signal. The stage 3 divider may also generate an S4 Ack signal, for example. Various embodiments of the invention may not be limited to 7 divider stages. Each stage scale factor may not be limited to values comprising 1, 2, or 3 in various embodiments of the invention.

Figure 4:
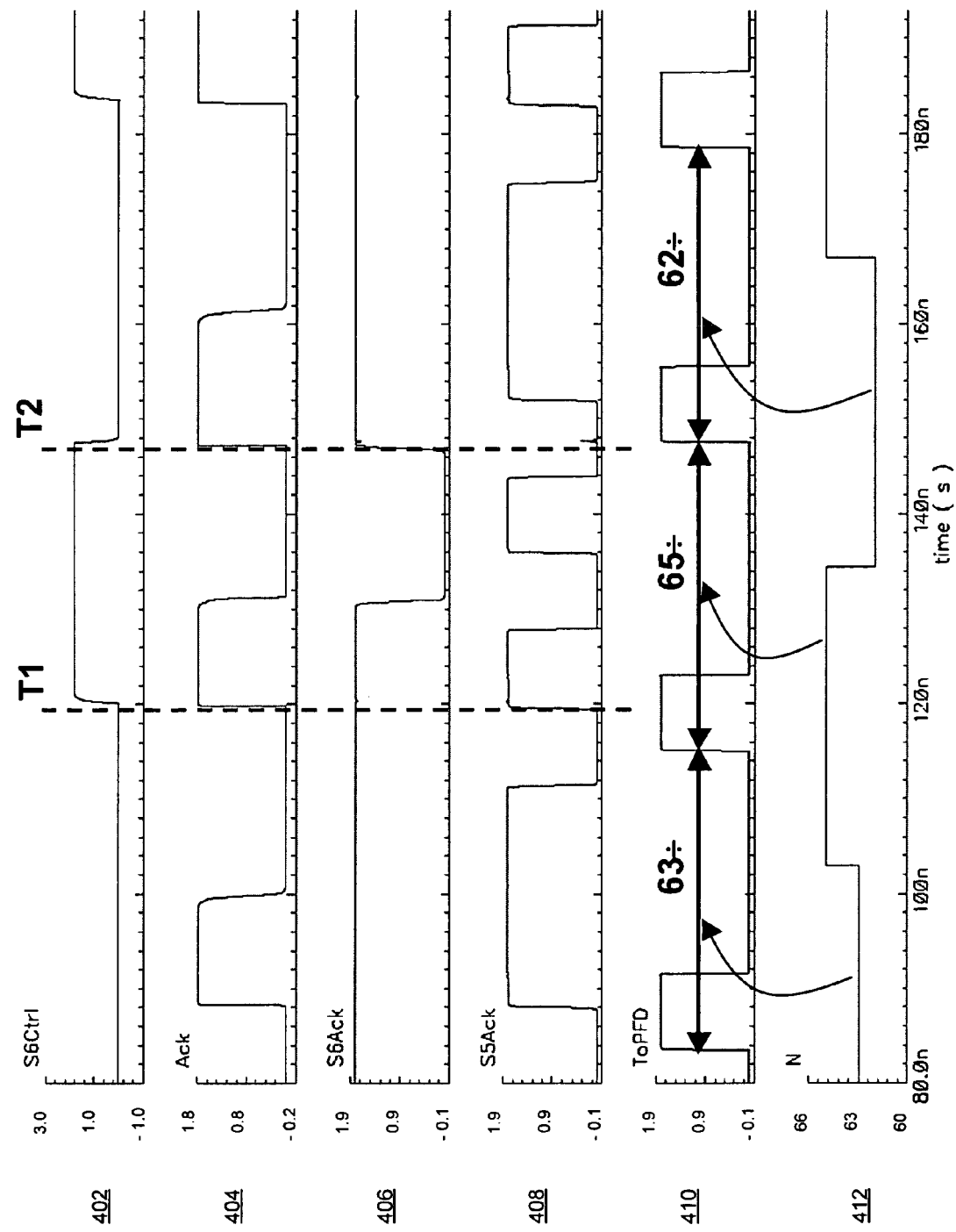
FIG. 4 is a diagram illustrating exemplary signals for enabling and disabling divider stage operation utilizing per-cycle values for the division number N, in accordance with an embodiment of the invention.

FIG. 4 is a diagram illustrating exemplary signals for enabling and disabling divider stage operation utilizing per-cycle values for the division number N, in accordance with an embodiment of the invention. Referring to FIG. 4, there is shown a S6 Ctrl signal 402, an Ack signal 404, an S6 Ack signal 406, an S5 Ack signal 408, a to PFD signal 410, and a division number N signal 412. Also shown in FIG. 4 are labeled time instants T1 and T2. Each of the signals may represent a value for the corresponding signal at various time instants as represented in the time (s) axis, where s may represent time units measured in seconds, for example. The S6 Ctrl signal 402, Ack signal 404, S6 Ack signal 406, S5 Ack signal 408, and output PFD (To PFD) signal 410, may each represent a signal level, as measured in volts, at various time instants. The division number N signal 412 may represent a value for the division number N at various time instants.

In operation, during a current division cycle preceding the time instant T1, the division number N may be N=63 in accordance with the output PFD signal 410. The output PFD signal 410 may indicate a time duration in which the current division number N may be maintained. The number of engaged division stages may correspond to m=5. The division blocks 304c and/or 304d may be maintained in a predefined reset state when not engaged. The range of division number N values may comprise 32 to 63.

When the divider block 304b has completed frequency division on the received input VCO signal 303, the completion may be indicated in the S5 Ack signal 406. When the TCU 302 receives a signal level HIGH in the S5 Ack signal 406, a Clk signal (FIG. 3) may be generated in which the corresponding signal level is HIGH, for example. In response, the division number N generator 306 may output a bit stream P<0 . . . 7> (FIG. 3). The TCU 302 may store the value associated with the bit stream P<0 . . . 7>. The stored value may be loaded and utilized by at least a portion of the plurality of division blocks 304a, 304b, 304c, and 304d during the succeeding division cycle subsequent to the time instant T1.

During the succeeding division cycle subsequent to the time instant T1, the division number N may be N=65 in accordance with the PFD signal 410. The number of engaged division stages may correspond to m=6. The range of division number N values may comprise 64 to 127. The TCU 302 may set the signal level associated with the S6 Ctrl 402 signal to engage the divider block 304c during the succeeding division cycle. Prior to being engaged, the divider block 304c may have been maintained in a predefined reset state. The divider block 304d may continue to be maintained in the predefined reset state during the succeeding division cycle.

When the divider block 304c has completed frequency division on the received input VCO signal 303, the completion may be indicated in the S6 Ack signal 406. When the TCU 302 receives a signal level HIGH in the S6 Ack signal 406, a Clk signal may be generated in which the corresponding signal level is HIGH, for example. In response, the division number N generator 306 may output a bit stream P<0 . . . 7> whose corresponding value may be stored, loaded, and be utilized by at least a portion of the plurality of division blocks 304a, 304b, 304c, and 304d during the subsequent division cycle subsequent to the time instant T2. The Ack 404 signal may be generated based on the signals S5 Ack 408 and S6 Ack 406, for example.

During the subsequent division cycle subsequent to the time instant T2, the division number N may be N=62 in accordance with the PFD signal 410. The number of engaged division stages may correspond to m=5. The range of division number N values may comprise 32 to 63. The TCU 302 may set the signal level associated with the S6 Ctrl 402 signal to disengage the divider block 304c during the subsequent division cycle. The divider blocks 304c and 304d may be maintained in the predefined reset state during the subsequent division cycle. When the divider block 304b has completed frequency division on the received input VCO signal 303, the completion may be indicated in the S5 Ack signal 408.

Similarly, if the division number N is greater than or equal to 128 during a division cycle, the number of engaged division stages may correspond to m=7. The range of division number N values may comprise 128 to 255. The TCU 302 may set the signal levels associated with the S6 Ctrl 402, and S7 Ctrl (FIG. 3) signals to engage the divider blocks 304c and 304d during the division cycle.

When the divider block 304d has completed frequency division on the received input VCO signal 303, the completion may be indicated in the S7 Ack signal (FIG. 3). The Ack signal may be generated based on the signals S5 Ack 408, S6 Ack, 406 and S7 Ack, for example.

Figure 5:
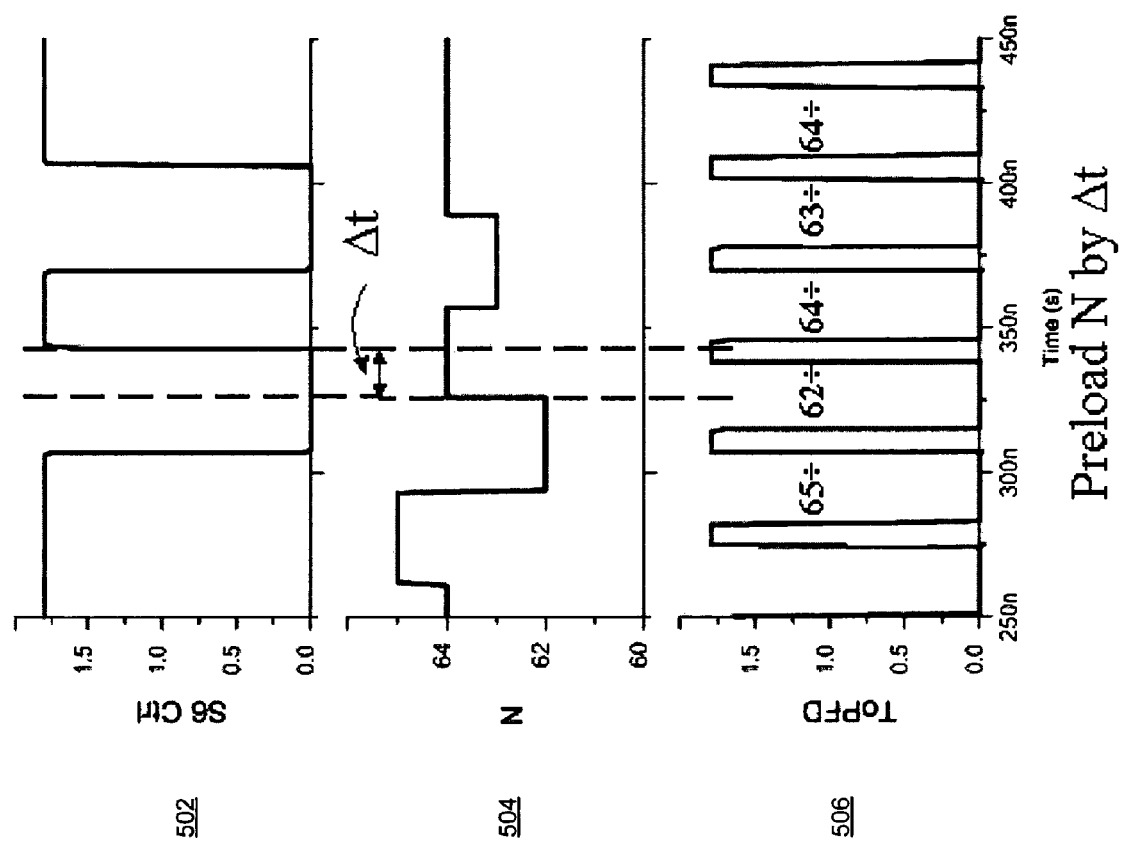
FIG. 5 is a diagram illustrating exemplary preloading of the division N number, in accordance with an embodiment of the invention.

FIG. 5 is a diagram illustrating exemplary preloading of the division N number, in accordance with an embodiment of the invention. Referring to FIG. 5, there is shown an S6 Ctrl signal 502, a division number N signal 504, and an output PFD (To PFD) signal 506. Also shown in FIG. 5 is a time duration Δt. Each of the signals may represent a value for the corresponding signal at various time instants as represented in the time (s) axis. The S6 Ctrl signal 502, and output PFD signal 506, may each represent a signal level, as measured in volts, at various time instants. The division number N signal 504 may represent a value for the division number N at various time instants.

Subsequent to completion of frequency division in a current division cycle, the TCU 302 may receive an Ack signal 404, S5 Ack signal 408, S6 Ack signal 406, and/or S7 Ack signal (FIG. 3), and begin the process of determining the number of stages to be utilized during the succeeding division cycle.

As shown in FIG. 5, for the current division cycle, which begins at a time instant shortly following the time=300 ns time instant, the division number N may be N=62 as shown in the division number N signal 504 and in accordance with the output PFD signal 506. The corresponding index value may be m=5. The divider block 304c may be disengaged. The signal level associated with the S6 Ctrl signal 502 may transition from HIGH to LOW shortly following the time=300 ns time instant corresponding to the disengagement of the divider block 304c.

The succeeding division cycle may begin at a time instant shortly preceding the time=350 ns time instant. In the succeeding division cycle the division number N may be N=64 as shown in the division number N signal 504 and in accordance with the output PFD signal 506. The corresponding index value may be m=6. At about a time instant time=325 ns, the TCU 302 may generate a Clk signal (FIG. 3) that causes the division number N generator 306 to generate a bit stream P<0 . . . 7> whose value corresponds to the division number N N=64. The time instant at about time=325 ns may correspond to the beginning of the time duration Δt. The time instant time=325 may represent a time instant that is subsequent to a time instant at which an S5 Ack 408 signal level HIGH to signal level LOW transition was generated. The signal level HIGH to signal level LOW transition may indicate the completion of frequency division by the divider block 304b during the current division cycle.

In instances where the divider blocks 304a, 304b, 304c and/or 304d are either in a predetermined preset state, or have completed their function within the current division cycle, the TCU 302 may cause the division number N=64 to be loaded into the divider blocks 304a, 304b, 304c, and/or 304d in advance of the beginning of the succeeding division cycle. This loading process may be referred to as preloading. The bits P<0 . . . 3> may be preloaded into the division block 304a, the bit P<4> may be preloaded into the division block 304b, the bit P<5> may be preloaded into the division block 304c, and the bit P<6> may be preloaded into the division block 304d, for example. At the beginning of the succeeding division cycle, the divider block 304c may be engaged while the divider block 304d may be maintained in a predetermined preset state. The TCU 302 may generate a signal level LOW to signal level HIGH transition in the S6 Ctrl signal 502, which may result in the divider block 304c being engaged during the succeeding division cycle.

In general, for a given division cycle that begins at a given time instant $t_{start}$, the division number N, which may be utilized during that given division cycle, may be preloaded at a time instant no later than the time instant corresponding to $(t_{start}-\Delta t)$.

Figure 6:
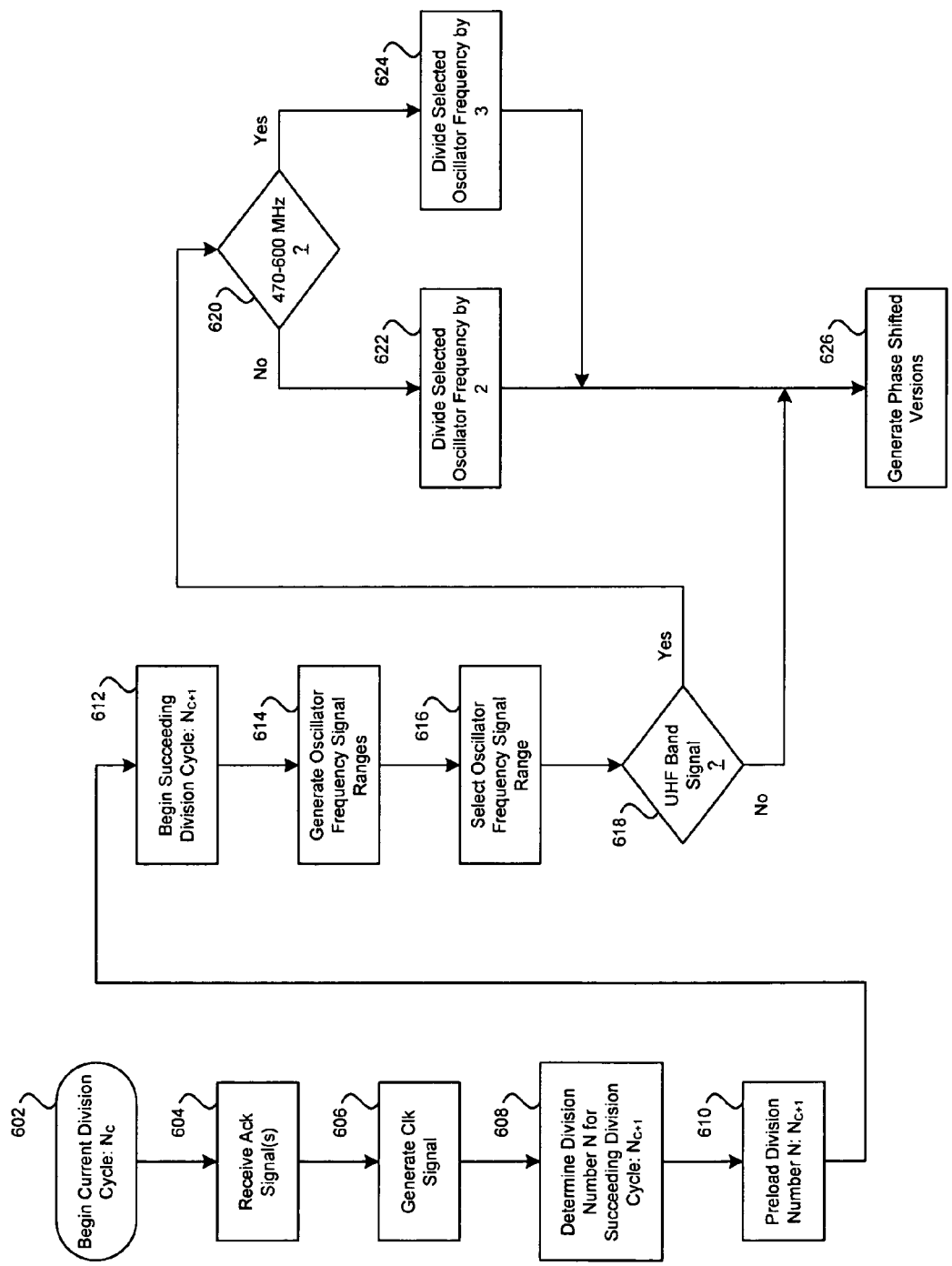
FIG. 6 is a flowchart illustrating exemplary steps for generating timing signals, in accordance with an embodiment of the invention.

FIG. 6 is a flowchart illustrating exemplary steps for generating timing signals, in accordance with an embodiment of the invention. Referring to FIG. 6, in step 602 the current division cycle $N_C$ may begin. During the current division cycle, the division number N may be $N=N_C$. In step 604, the TCU 302 may receive acknowledgment signals from the divider blocks 304b, 304c, and/or 304d. The acknowledgment signals may indicate that frequency division has been completed within the current division cycle. In step 606, the TCU 302 may generate a Clk signal. In step 608, the division number N, $N_{C+1}$, which may be utilized in the succeeding division cycle may be determined. During the current division cycle, the division number N may be $N=N_{C+1}$. In step 610, the division number $N_{C+1}$ may be preloaded into the division blocks 304a, 304b, 304c, and/or 304d. Corresponding control signals may also be asserted by the TCU 302 to engage division blocks 304c and/or 304d as required to implement the division number N during the succeeding division cycle, for example.

In step 612, the succeeding division cycle may begin. During the succeeding division cycle, the division number N may be $N=N_{C+1}$. In step 614, one or more oscillator signal ranges may be generated by a corresponding one or more VCO blocks 208. For example, in a system utilizing two VCO blocks 208, one VCO block may generate frequencies corresponding to an upper frequency range, $f_{upper}$, while a second VCO block may generate frequencies corresponding to a lower frequency range $f_{lower}$. In an exemplary embodiment of the invention, the frequency range $f_{lower}$ may comprise frequencies between 1.2 GHz and 1.5 GHz, while the frequency range $f_{upper}$ may comprise frequencies between 1.5 and 1.8 GHz. In step 616, a frequency range may be selected. The corresponding VCO block among a plurality of VCO blocks may also be selected. The corresponding oscillator signal generated by the selected VCO block may be utilized to demodulate a received signal. The frequency range may be selected based on a frequency associated with a signal received by the dual band RF receiver 140a, for example.

Step 618 may determine whether the received signal frequency is within the ultra high frequency (UHF) band for television broadcast signals, for example. When the received signal is not within the UHF frequency band, a plurality of phase shifted version of the selected oscillator signal may be generated in step 626. The selected oscillator signal may be generated by the VCO block selected in connection with step 616. In various embodiments of the invention, two phase shifted versions of the oscillator signal may be generated: a first version may be phase shifted 45° relative to the oscillator signal, and a second version may be phase shifted −45° relative to the oscillator signal. An L-band signal, comprising a frequency range from 1.4 GHz to 1.8 GHz is an exemplary received signal that may not be within the UHF frequency band for television broadcast signals, for example.

When the received signal is within the UHF frequency band for television broadcast signals, step 620 may determine whether the received signal frequency may be within the 470 MHz to 600 MHz frequency range. When the received signal frequency may be within the 470 MHz to 600 MHz frequency range, in step 622 a signal may be generated whose frequency is ⅓ the frequency associated with the selected oscillator signal. When the received signal frequency may not be within the 470 MHz to 600 MHz frequency range, in step 624 a signal may be generated whose frequency is ½ the frequency associated with the selected oscillator signal. Step 626 may follow step 622 or step 624.

Various aspects of a system for generating timing signals may comprise a division number generator 306 that may enable determination of a division number N at a time instant within a division cycle. The time instant may be determined based on a Clk signal received from the timing control unit (TCU) 302. A phase frequency detector and charge pump 204, loop filter 206 may enable modification of an output clock signal, generated by the voltage controlled oscillator (VCO) 208, based on the division number in a succeeding division cycle. The modification may comprise generation of a control voltage $V_{cntl}$. The VCO 208 may enable generation of a subsequent output clock signal based on the modifying. The subsequent output clock signal may comprise an amplitude, phase, and/or frequency that may differ from the corresponding quantity or quantities in the output clock signal.

The prescaler 210 may enable determination of the division number based on a plurality of scale factors associated with a corresponding plurality of stages. The plurality of scale factors may be set by configuring the divider blocks 304a, 304b, 304c, and/or 304d. The divider blocks 304a, 304b, 304c, and/or 304d may enable selection of a numerical value for each of the plurality of scale factors based on a corresponding portion of bits in a binary representation of a generated division number. The scale factors may be represented by $n_{stage}$ where the index stage may represent a stage number, for example stage=0, 1, 2 . . . . The generated division number may comprise a representation of a bit stream P<0 . . . 7> generated by the division number generator 306. The TCU 302 may assert one or more control signals that may engage a corresponding stage and/or divider block that comprise circuitry for implementing the function associated with the stage.

A VCO block 208 may be utilized to enable generation of an output clock signal. In various embodiments of the invention a VCO block 176 may comprise a plurality of VCO blocks 208, which may be utilized to generate a corresponding plurality of output clock signals. The VCO block 176 may enable selection of one of the generated plurality of output clock signals by the corresponding plurality of VCO blocks 208. The selected output clock signal may be based on a channel frequency associated with a signal received by the dual band RF receiver 140a via an antenna 142a and/or 142b.

The local oscillator signal divider 156 may enable modification of the selected output clock signal based on a frequency scaling factor. The frequency scaling factor may generate a modified clock signal by modifying the frequency of a received clock signal. The local oscillator signal divider 156 may enable selection of a numerical value for the frequency scaling factor based on a scale control signal. The scale control signal may be generated based on the programmable gain amplifier (PGA) control signal (FIG. 1C). A value associated with the scale control signal may be based on the channel frequency. Based on the channel frequency the value of the scale control signal may enable the local oscillator signal divider 156 to divide the received clock frequency by a factor of 1, 2, or 3, for example. The received clock frequency may be divided by a factor of 2 when the received channel frequency may be within the 600 MHz to 900 MHz frequency range, for example. The received clock frequency may be divided by a factor of 3 when the received channel frequency may be within the 470 MHz to 600 MHz frequency range, for example. Otherwise, the frequency scale factor may be 1, for example. The modification may comprise generating a plurality of phase shifted versions of the modified selected clock signal. For example, after frequency division, the local oscillator signal divider 156 may generate two phase shifted versions of the frequency divided signal. The relative phase difference between the two phase shifted version may be 90 degrees, for example.

In various embodiments of the invention, the local oscillator signal divider 156 may enable the a reduction in the number of VCO blocks 208 that may be required in the VCO block 176 to support the range of frequencies associated with signals received by the dual band RF receiver 140*a*. In an embodiment of the invention, the VCO block 176 may comprise 2 VCO blocks 208 that may generate a range of frequencies from 1.2 GHz to 1.8 GHz. A frequency division by a scale factor of 2 may produce a frequency range of 600 MHz to 900 MHz, while a frequency division by 3 may produce a frequency range of 400 MHz to 600 MHz. Thus, by utilizing frequency division, the VCO block 176 may support frequency ranges comprising 400 MHz to 600 MHz, 600 MHz to 900 MHz, and 1.2 GHz to 1.8 GHz, for example.

Without the frequency division capability as supported by the local oscillator signal divider 156, the VCO block 176 may be required to support a frequency range comprising 470 MHz to 1.8 GHz. To support such a wide frequency range, the VCO block 176 may be required to comprise more than two VCO blocks 208 and the Σ-Δ Fractional Synthesizer block 174 may require extensive modifications. Similarly, if the local oscillator divider 156 supported only a frequency division by a scale factor of 2, the VCO block 176 may be required to support a frequency range of approximately 940 MHz to 1.8 GHz. This frequency range may also require that the VCO block 176 comprise more than two VCO blocks 208 and the Σ-Δ Fractional Synthesizer block 174 may require extensive modifications. If the local oscillator divider 156 supported only a frequency division by a scale factor of 3, the VCO block 176 may be required to support a frequency range of approximately 1.2 GHz to 2.7 GHz. This frequency range may also require that the VCO block 176 comprise more than two VCO blocks 208 and the Σ-Δ Fractional Synthesizer block 174 may require extensive modifications.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for generating timing signals, the method comprising:
    determining a division number at a time instant within a division cycle;
    modifying a local oscillator signal based on said division number in a succeeding division cycle;
    generating a subsequent local oscillator signal based on said modifying;
    determining said division number based on a plurality of scale factors associated with a corresponding plurality of stages; and
    selecting a numerical value for each of said plurality of scale factors based on a corresponding portion of bits in a binary representation of a generated division number.

2. The method according to claim 1, comprising selecting said numerical value for at least a portion of said plurality of scale factors based on a corresponding stage control signal.

3. The method according to claim 1, comprising
    generating a plurality of said local oscillator signals.

4. The method according to claim 3, comprising selecting one of said generated plurality of said local oscillator signals based on a channel frequency.

5. The method according to claim 4, comprising modifying said selected one of said generated plurality of said local oscillator signals based on a frequency scaling factor.

6. The method according to claim 5, comprising selecting a numerical value for said frequency scaling factor based on a scale control signal.

7. The method according to claim 6, wherein a value associated with said scale control signal is based on said channel frequency.

8. The method according to claim 5, wherein said modification comprises generating a plurality of phase shifted version of said modified said selected one of said generated plurality of said local oscillator signals.

9. A system for generating timing signals, the system comprising:
    one or more circuits that are operable to determine a division number at a time instant within a division cycle;
    said one or more circuits are operable to modify a local oscillator signal based on said division number in a succeeding division cycle;
    said one or more circuits are operable to generate a subsequent local oscillator signal based on said modifying;
    said one or more circuits are operable to determine said division number based on a plurality of scale factors associated with a corresponding plurality of stages; and
    said one or more circuits are operable to select a numerical value for each of said plurality of scale factors based on a corresponding portion of bits in a binary representation of a generated division number.

10. The system according to claim 9, wherein said one or more circuits are operable to select said numerical value for at least a portion of said plurality of scale factors based on a corresponding stage control signal.

11. The system according to claim 9,
wherein said one or more circuits are operable to generate a plurality of said local oscillator signals.

12. The system according to claim 11, wherein said one or more circuits are operable to select one of said generated plurality of said local oscillator signals based on a channel frequency.

13. The system according to claim 12, wherein said one or more circuits are operable to modify said selected one of said generated plurality of said local oscillator signals based on a frequency scaling factor.

14. The system according to claim 13, wherein said one or more circuits are operable to select a numerical value for said frequency scaling factor based on a scale control signal.

15. The system according to claim 14, wherein a value associated with said scale control signal is based on said channel frequency.

16. The system according to claim 13, wherein said modification comprises generating a plurality of phase shifted version of said modified said selected one of said generated plurality of said local oscillator signals.

17. A method for generating timing signals, the method comprising:
    determining a division number at a time instant within a division cycle;
    modifying a local oscillator signal based on said division number in a succeeding division cycle;
    generating a subsequent local oscillator signal based on said modifying;
    generating a plurality of said local oscillator signals;
    selecting one of said generated plurality of said local oscillator signals based on a channel frequency; and
    modifying said selected one of said generated plurality of said local oscillator signals based on a frequency scaling factor, wherein said modification comprises generating a plurality of phase shifted version of said modified said selected one of said generated plurality of said local oscillator signals.

18. A system for generating timing signals, the system comprising:
    one or more circuits that are operable to determine a division number at a time instant within a division cycle;
    said one or more circuits are operable to modify a local oscillator signal based on said division number in a succeeding division cycle;
    said one or more circuits are operable to generate a subsequent local oscillator signal based on said modifying;
    said one or more circuits are operable to generate a plurality of said local oscillator signals;
    said one or more circuits are operable to select one of said generated plurality of said local oscillator signals based on a channel frequency; and
    said one or more circuits are operable to modify said selected one of said generated plurality of said local oscillator signals based on a frequency scaling factor, wherein said modification comprises generating a plurality of phase shifted version of said modified said selected one of said generated plurality of said local oscillator signals.

* * * * *